US006537011B1

(12) United States Patent
Wang et al.

(10) Patent No.: US 6,537,011 B1
(45) Date of Patent: Mar. 25, 2003

(54) METHOD AND APPARATUS FOR TRANSFERRING AND SUPPORTING A SUBSTRATE

(75) Inventors: Danny Wang, San Jose, CA (US); Dmitry Lubomirsky, Cupertino, CA (US); Erwin Polar, San Jose, CA (US); Brigitte Stoehr, San Jose, CA (US); Mark Wiltse, Redwood City, CA (US); Yeuk-Fai Edwin Mok, San Francisco, CA (US); Frank C. Ma, Scotts Valley, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/629,322

(22) Filed: Jul. 31, 2000

Related U.S. Application Data
(60) Provisional application No. 60/188,317, filed on Mar. 10, 2000.

(51) Int. Cl.$^7$ .............................................. B65G 49/07
(52) U.S. Cl. ...................... 414/217; 414/941; 118/728; 118/729
(58) Field of Search ............................... 414/217, 941; 118/728, 729

(56) References Cited

U.S. PATENT DOCUMENTS

| | | | |
|---|---|---|---|
| 4,586,743 A | 5/1986 | Edwards et al. ........... 294/86.4 |
| 4,705,951 A | 11/1987 | Layman et al. .......... 250/442.1 |
| 4,813,732 A | 3/1989 | Klem ....................... 294/103.1 |
| 4,842,683 A | * 6/1989 | Cheng et al. ................ 156/345 |
| 4,848,814 A | * 7/1989 | Suzuki et al. ................ 294/1.1 |
| 4,869,801 A | * 9/1989 | Helms et al. ........... 204/298.15 |
| 5,022,695 A | 6/1991 | Ayers ........................... 294/88 |
| 5,133,635 A | 7/1992 | Malin et al. .............. 414/744.8 |
| 5,180,276 A | 1/1993 | Hendrickson ................ 414/752 |
| 5,280,983 A | 1/1994 | Maydan et al. ........... 294/119.1 |
| 5,324,155 A | 6/1994 | Goodwin et al. ............ 414/225 |
| 5,374,147 A | 12/1994 | Hiroki et al. ................ 414/217 |
| 5,469,035 A | 11/1995 | Lowrance ................ 318/568.1 |
| 5,580,388 A | 12/1996 | Moore ......................... 118/728 |
| 5,611,865 A | * 3/1997 | White et al. ................. 118/729 |

(List continued on next page.)

FOREIGN PATENT DOCUMENTS

| | | | |
|---|---|---|---|
| EP | 0 423 608 A1 | 4/1991 | ............ B25J/9/12 |
| EP | 0 793 262 A2 | 9/1997 | .......... H01L/21/00 |
| EP | 0 840 358 | 5/1998 | .......... H01L/21/00 |
| JP | 61273441 | * 12/1986 | |
| JP | 10-74814 | 3/1998 | .......... H01L/21/68 |
| JP | 11008291 | 1/1999 | .......... H01L/21/68 |
| WO | WO 99/23691 | 5/1999 | .......... H01L/21/00 |

OTHER PUBLICATIONS

PCT International Search Report dated Jan. 5, 1999.
Sundar, Satish, "Improved Throughput Using Time–Optimal Motion Planning and Design".
PCT Partial International Search Report from PCT/US 01/07932, Dated Sep. 18, 2001.

*Primary Examiner*—Steven A. Bratlie
(74) *Attorney, Agent, or Firm*—Moser Patterson & Sheridan

(57) ABSTRACT

A method and apparatus for supporting and transferring a substrate in a semiconductor wafer processing system. In one aspect, a support ring having one or more substrate support members mounted thereon and defining a central opening therein for receipt of a substrate support member during processing is disclosed. In another aspect, a substrate handler blade having a plurality of substrate supports disposed thereon is provided which is adapted to support a substrate thereon and effectuate substrate transfer between the substrate handler blade and the support ring.

22 Claims, 14 Drawing Sheets

U.S. PATENT DOCUMENTS

| | | | |
|---|---|---|---|
| 5,643,366 A | * 7/1997 | Somek et al. | 118/728 X |
| 5,647,626 A | 7/1997 | Chen et al. | 294/87.1 |
| 5,669,644 A | * 9/1997 | Kaihotsu et al. | 414/941 X |
| 5,702,228 A | 12/1997 | Tamai et al. | 414/744.5 |
| 5,720,590 A | 2/1998 | Hofmeister | 414/744.2 |
| 5,733,096 A | 3/1998 | Van Doren et al. | 414/744.3 |
| 5,791,895 A | * 8/1998 | Kyung et al. | 118/729 X |
| 5,820,685 A | * 10/1998 | Kurihara et al. | 118/729 |
| 6,203,617 B1 | * 3/2001 | Tanoue et al. | 118/695 |
| 6,217,663 B1 | * 4/2001 | Inokuchi et al. | 118/728 |

* cited by examiner

METHOD AND APPARATUS FOR TRANSFERRING AND SUPPORTING A SUBSTRATE

This application claims priority to provisionally filed U.S. Patent Application Ser. No. 60/188,317, entitled 'Method and Apparatus for Transferring and Supporting a Substrate' and filed on Mar. 10, 2000.

BACKGROUND OF THE INVENTION

1. Field of the Invention

The invention generally relates to a method and apparatus for supporting and transferring substrates during photomask fabrication.

2. Background of the Related Art

Semiconductor device geometries have dramatically decreased in size since such devices were first introduced several decades ago. Since then, integrated circuits have generally followed the two year/half-size rule (often called Moore's Law), which states that the number of devices on a chip doubles every two years. Today's fabrication plants are routinely producing devices having 0.35 $\mu$m and even 0.18 $\mu$m feature sizes, and tomorrow's plants soon will be producing devices having even smaller geometries.

As the fringes of sub-micron technology are pressed, the increasing circuit densities have placed additional demands on processes used to fabricate semi-conductor devices. For example, as circuit densities increase, the widths of vias, contacts and other features, as well as the dielectric materials between them, decrease to sub-micron dimensions, whereas the thickness of the dielectric layers remains substantially constant, with the result that the aspect ratios for the features, i.e., their height divided by width, increases. Reliable formation of high aspect ratio features is important to the success of sub-micron technology and to the continued effort to increase circuit density and quality of individual substrates and die.

High aspect ratio features are conventionally formed by patterning a surface of a substrate to define the dimensions of the features and then etching the substrate to remove material and define the features. To form high aspect ratio features with a desired ratio of height to width, the dimensions of the features are required to be formed with certain parameters, which is typically defined as the critical dimensions of the features. Reliable formation of high aspect ratio features with desired critical dimensions requires precise patterning and subsequent etching of the substrate.

Photolithography is a technique used to form precise patterns on substrates. In conventional photolithographic processes, a photoresist is applied on the layer or layers to be etched and the features to be etched in the layer, such as contacts, vias, or interconnects, are defined by exposing the photoresist to a pattern of light through a photolithographic substrate, or photomask, that defines the desired configuration of the features. A light source emitting ultraviolet (UV) light may be used to expose the photoresist to chemically alter the composition of the photoresist. The exposed, or alternatively, the unexposed photoresist material is then removed to expose the underlying material of the substrate and the retained photoresist material remains as an etch resistant pattern on the substrate. The exposed underlying material is then etched to form the desired features in the substrate.

Photolithographic photomasks, or reticles, typically comprise a substrate of an optically transparent silicon based material, such as quartz, having a light-shielding layer of metal, typically chromium, patterned on the surface of the substrate. The metal layer is patterned and etched to form features which define the pattern and correspond to the dimensions of the features to be transferred to the substrate patterned by the photolithographic process.

The deposition and etching of the photomask requires that the substrate be transferred and supported within a processing system. It has become desirable to utilize processing equipment and systems which are configured to process the substrates themselves to fabricate the photomasks. However, these systems are typically configured to process circular substrates and must be reconfigured to support and transfer rectangular photomasks. In addition, the systems used to support and transport the substrates used in photomask fabrication must carefully handle the substrates to prevent scratches and other defects from being formed on the substrates. These defects can alter the light transmission properties of the substrates and result in defective photomasks.

Therefore, there is a need for a method and apparatus for transferring and supporting substrates in processing systems which minimizes defect formation.

SUMMARY OF THE INVENTION

One aspect of the invention provides an apparatus for supporting a substrate on a pedestal or cathode in a processing chamber to minimize contact between the substrate and the chamber components during processing. In another aspect of the invention, a substrate handler blade is provided to support a substrate during transfer to minimize contact between the substrate handler and the substrate and to retain angular and linear alignment of the substrate on the blade.

The present invention generally provides a substrate support member design in a plasma etch chamber and a substrate handler blade design to minimize defect formation in a substrate during processing and handling of substrates. One aspect of the invention provides an apparatus for supporting a substrate comprising a support ring having one or more substrate support members mounted on the support ring, and one or more openings extending through the one or more substrate support members for accepting a substrate. Preferably, the one or more substrate support members include an upper portion, a lower portion, and a tapered portion disposed between the upper portion and the lower portion, where the lower portion has an inclined surface.

The apparatus for supporting a substrate may be used in a processing chamber comprising an enclosure defining a process region, a substrate support member having a support surface disposed in the enclosure, and a support ring coupled to the support surface and adapted to receive a substrate.

Another aspect of the invention provides a substrate handler blade comprising a base plate and one or more retaining wings extending from the base plate. The one or more retaining wings comprise a base portion, a vertical support position, and an end portion, preferably with the vertical support portion comprising an inward facing inclined surface.

The apparatus for supporting a substrate may also be used in a substrate processing system comprising a transfer chamber, at least one processing chamber having a substrate support member with a support surface and a support ring coupled to the support surface, the support ring adapted to receive a substrate, and a substrate handler disposed in the transfer chamber. Preferably, the substrate processing system further comprises a substrate handler blade including a base plate and one or more retaining wings extending from the base plate connected to the substrate handler.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
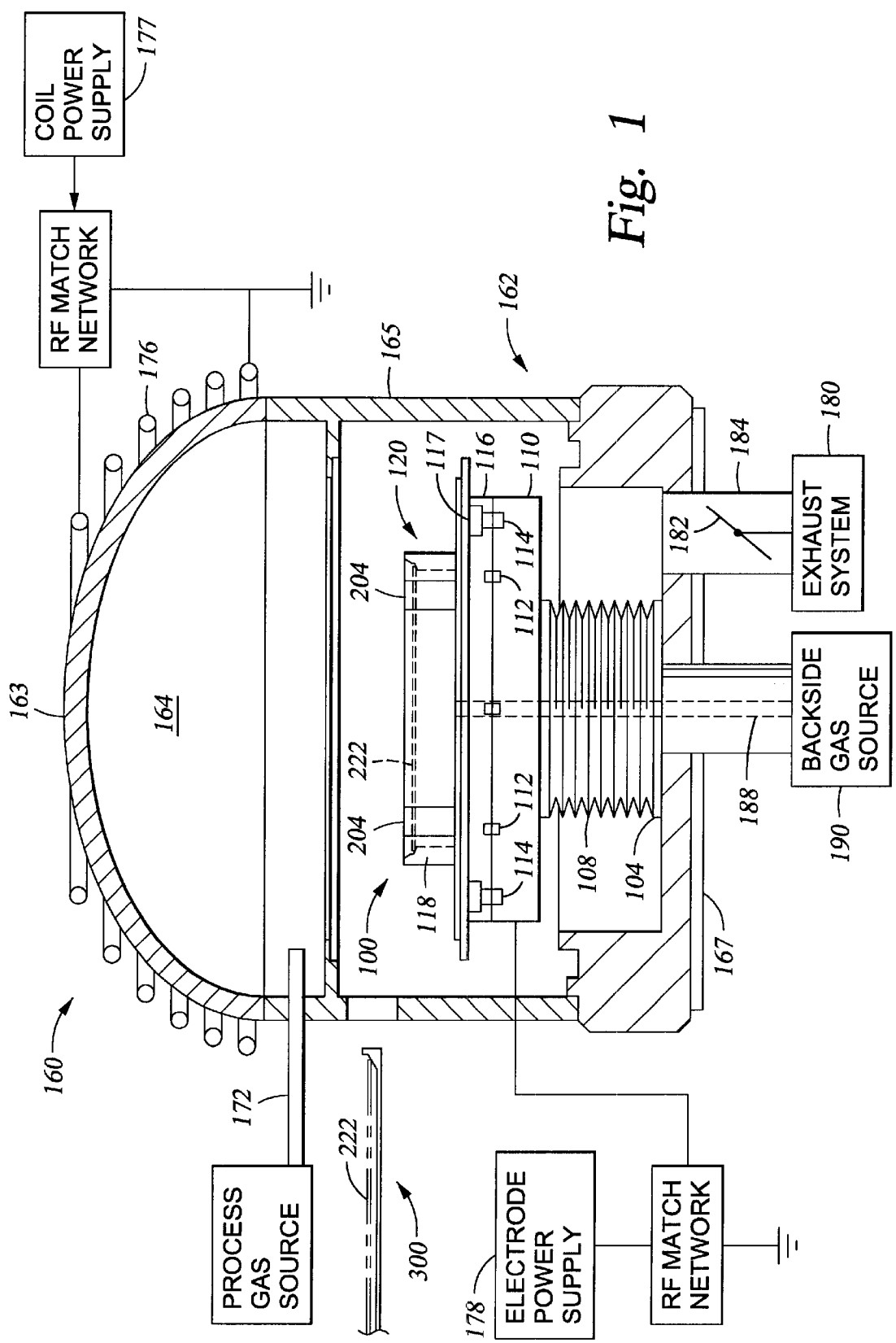
FIG. 1 is a schematic view of an etching chamber containing the support ring of the invention.

FIG. 1 is a schematic cross sectional view of one embodiment of a process chamber 160 having a substrate support member disposed therein and a substrate handler blade 300 positioned adjacent thereto. The process chamber 160 generally includes a cylindrical side wall or chamber body 162, an energy transparent dome ceiling 163 and a chamber bottom 167. An inductive coil 176 is disposed around at least a portion of the dome 163. The chamber body 162 and chamber bottom 167 of the chamber 160 can be made from a metal, such as anodized aluminum, and the dome 163 can be made of an energy transparent material such as a ceramic or other dielectric material. A substrate support member 100, such as a cathode assembly, is disposed in the chamber 160 to support a substrate 222 during processing. A plasma zone 164 is defined by the process chamber 160 above an upper surface of the substrate support member 100. A top housing (not shown) generally encloses the process chamber 160.

Process gases are introduced into the plasma etch chamber 160 through a gas distributor 172 peripherally disposed about the substrate support member 100. Process gases and etchant byproducts are exhausted from the process chamber 160 through an exhaust system 180. A throttle valve 182 is provided in an exhaust port 184 for controlling the pressure in the plasma etch chamber 160. An endpoint measurement device may be included to determine the endpoint of a process performed in the chamber.

One chamber which can be used to advantage is an inductively coupled plasma etch chamber, such as a Decoupled Plasma Source, or DPS™, chamber manufactured by Applied Materials, Inc., of Santa Clara, Calif. Other process chambers are also suitable for use herein, including deposition as well as etch chambers. Other chamber types may include, for example, capacitively coupled parallel plate chambers and magnetically enhanced ion etch chambers.

Generally, the substrate support member 100 comprises a support ring 120 having one or more substrate support members 204 mounted thereon or otherwise connected thereto. Generally, the substrate handler blade 300 comprises a flat base plate 302 having substrate supports connected thereto. The substrate supports are disposed on each end of the blade and a pair of retaining wings extend laterally from the base plate and define an outer lateral perimeter of a substrate receiving surface. The substrate support member 100 and the substrate handler blade 300 will be defined in more detail below. In addition, the cooperation of the substrate support member 100 and the substrate handler blade 300 will be described and illustrated below.

The substrate support member 100 is powered by an electrode power supply 178 to generate a capacitive electric field in the plasma etch chamber 160. Typically an RF voltage is applied to the substrate support member 100 while the chamber body 162 is electrically grounded. The capacitive electric field forms a bias which accelerates inductively formed plasma species toward the substrate 222 to provide a more vertically oriented anisotropic etching of the substrate 222.

Figure 2:
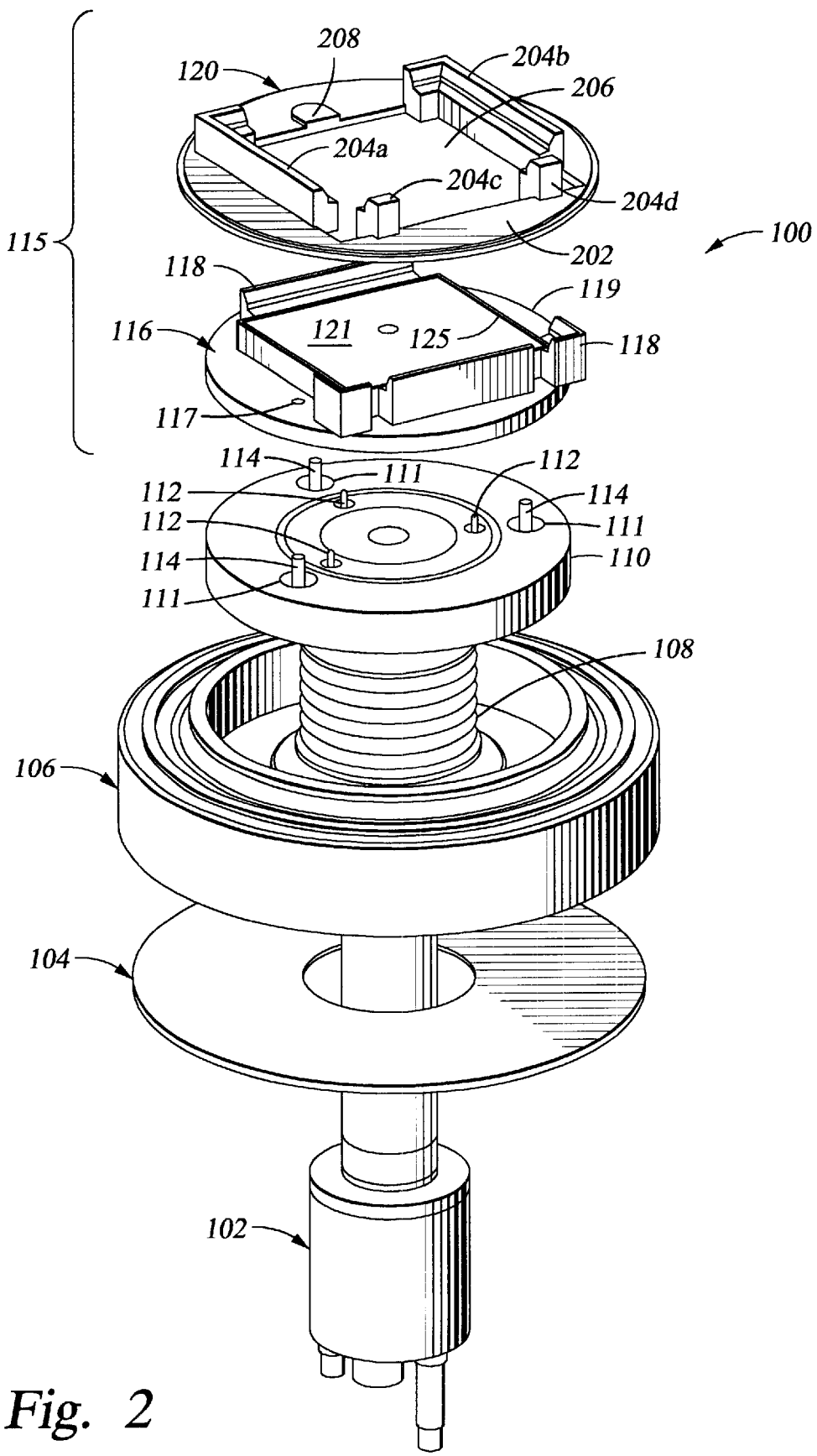
FIG. 2 is an exploded perspective view of a substrate support member 100 with a support ring mounted thereon.

FIG. 2 is an exploded perspective view of one embodiment of a substrate support member 100. The substrate support member 100 includes a body 106, a temperature controlled base 110, a substrate supporting assembly 115 including a lower pedestal 116 and an upper support ring 120. The body 106 and the temperature controlled base 110 are mounted on a shaft 102. In the embodiment shown, the body 106 and the temperature controlled base are vertically movable in the chamber. However, in an alternative embodiment, a lower support assembly, such as body 106 and temperature controlled base 110, may be stationary within the chamber. The temperature controlled base 110 is recessed into the body 106 and includes pedestal alignment pins 112 for aligning the lower pedestal 116 thereon. Channels 111 (three are shown) are also disposed through the temperature controlled base 110 and house movable lift pins 114 therein. The lift pins 114 engage the lower surface of the upper support ring 120 to move the upper support ring vertically within the chamber relative to the lower pedestal 116. The temperature controlled base 110 is mounted on the body 106 to regulate the temperature of the lower pedestal 116. The body 106 can be made of a ceramic material and the temperature controlled base 110 and the lower pedestal 116 can be made of aluminum. The temperature controlled base may include fluid channels, heating elements, e.g., resistive heating elements or other temperature control members.

The body 106 of the substrate support member 100 is mounted on a stainless steel base 104, typically disposed on the bottom of a processing chamber (not shown), with the bulk head assembly 102 mounted through the bottom of the processing chamber and coupled to the body 106. The substrate support member 100 includes a bellows assembly 108 encased in the body 106 to maintain vacuum isolation between the interior of the chamber and the outside environment. Power, electrical controls, backpressure gases, and actuation are provided to the substrate support member 100 via the shaft 102. The lower pedestal 116 includes a lower mounting plate 119 and an upper body 121 having a substrate supporting ridge 125 disposed thereon. The lower mounting plate 119 and the upper body 121 may be monolithic or may be made of separate components connected together. The lower pedestal 116 further includes substrate supports 118 disposed around the perimeter of the upper body 121 and substrate supporting ridge 125. The substrate supports 118 include substrate receiving surfaces defined by an inner sloped surface of each substrate support 118. Channels 117 are formed through the lower pedestal 116 to enable the lift pins 114 disposed through the temperature controlled base 110 to move therethrough and lift the support ring 120 vertically. The vertical movement imparted by the lift pins 114 is used to lift the support ring 120 to effectuate substrate hand off between a substrate handler blade 300 and the support ring 120. The actuation of the assembly 115 will be described in more detail below.

The support ring 120 includes a base plate 202 having a plurality of substrate supports 204*a–d* formed thereon or connected thereto. The substrate supports 204*a–d* and the base plate 202 define a central opening 206 in which the upper body 121 and the substrate supports 118 of the lower pedestal 116 are received during processing. The substrate supports 118 on the lower pedestal are positioned so that they mate with the substrate supports 204*a–d* of the upper support ring 120 to define a planar substrate receiving surface having the upper body 121 of the lower pedestal 116 disposed therein. The lift pins 114 move the support ring 120 vertically above the lower pedestal 116 during substrate transfer and then lower the support ring onto the lower pedestal 116 for processing. The whole assembly 115 may then be moved vertically within the chamber 160.

Figure 3:
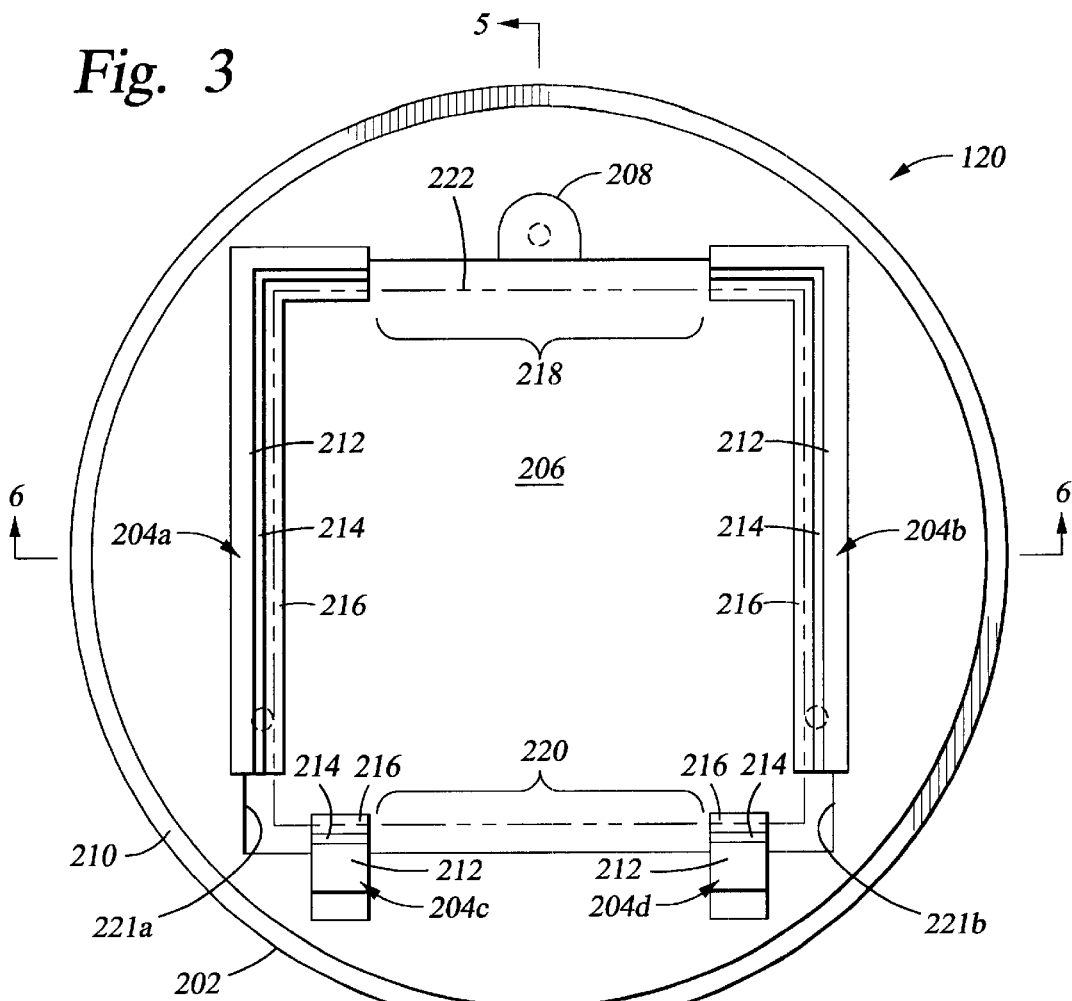
FIG. 3 is a schematic top view of the support ring of FIG. 3.

FIG. 3 is a top view of one embodiment of a support ring 120. The support ring 120 includes four substrate support members 204*a–d* mounted on the base 202. The base 202 is generally a circular ring with the central opening 206 defined therein. The base 202 is adapted for mounting on the lower pedestal 116. The base 202 further includes a circumferential sealing lip 210 formed at the perimeter of the base 202 which forms a seal with the processing chamber (shown in FIG. 1) when the substrate support member 100 is positioned in an upper processing position. A seal formed between the sealing lip 210 and the chamber prevents gases from flowing behind the substrate support member in contact with the lower portion of the chamber. The substrate support members 204*c,d* disposed on the base define an opening 220 through which a substrate handler blade can be moved to effectuate a substrate hand off. The substrate supports 118 can be moved vertically into a mating relationship with the substrate supports 204*c,d*. Similarly, the substrate support members 204*a,b* disposed opposite therefrom define an opening 218 through which a distal end of a substrate handler blade and the substrate supports 118 can be extended. Openings 221*a,b* are provided between the substrate supports 204*a* and 204*c* and 204*b* and 204*d*, respectively, to receive lateral wings (shown and described below in reference to FIG. 8.) of a substrate handler blade and the substrate supports 118 (shown and described below in reference to FIGS. 12–17) to minimize contact between components of the system. An alignment tab 208 is formed on the base 202 of the support ring 120 to assist in alignment of the substrate support member 100. During assembly, prior to starting the system, the alignment tab 208 provides a visual indication that the upper support ring 120 and substrate support assembly 115, generally, is properly positioned in the chamber 160.

Figure 4:
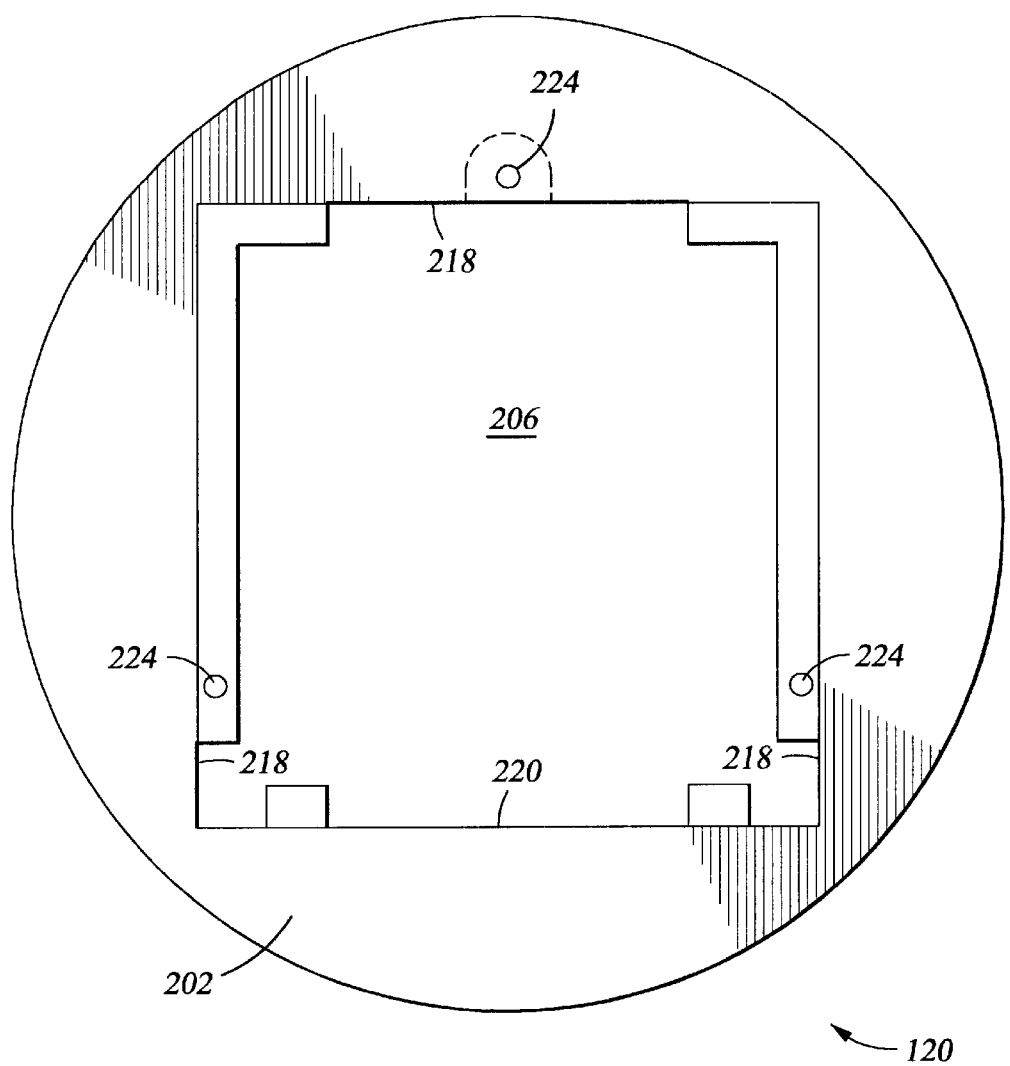
FIG. 4 is a schematic bottom view of the support ring of the invention.

FIG. 4 is a bottom view of the support ring of FIG. 3. A plurality of lift pin recesses 224 are formed in the base 202 around the opening 206 and are adapted to receive the lift pins 114. The lift pin recesses 224 are spaced around the perimeter of the support ring 120 to provide stable support for the support ring 120 when the support ring 120 is lifted into a raised position. The lift pins 114 and lift pin recesses 224 can also be used to align the support ring 112 on the lower pedestal 116.

Figure 5:
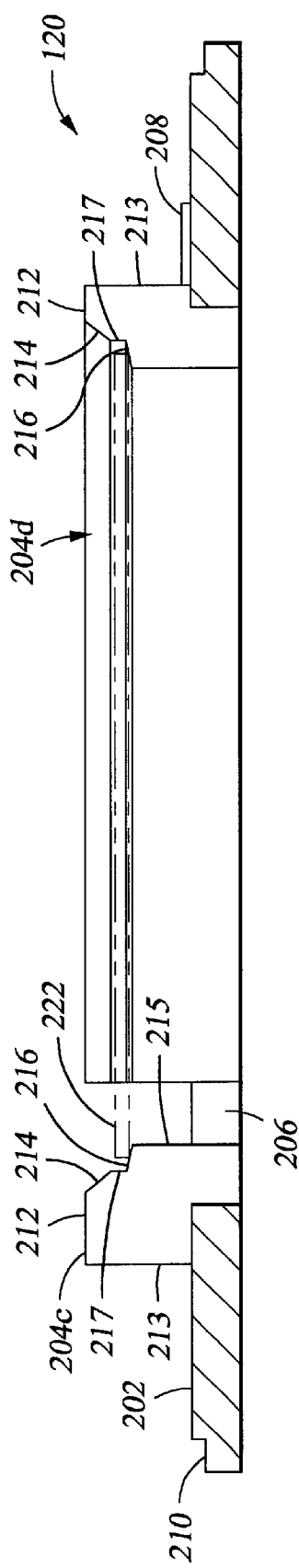
FIG. 5 is a schematic cross-sectional view taken along lines 5—5 of FIG. 3.
Figure 6:
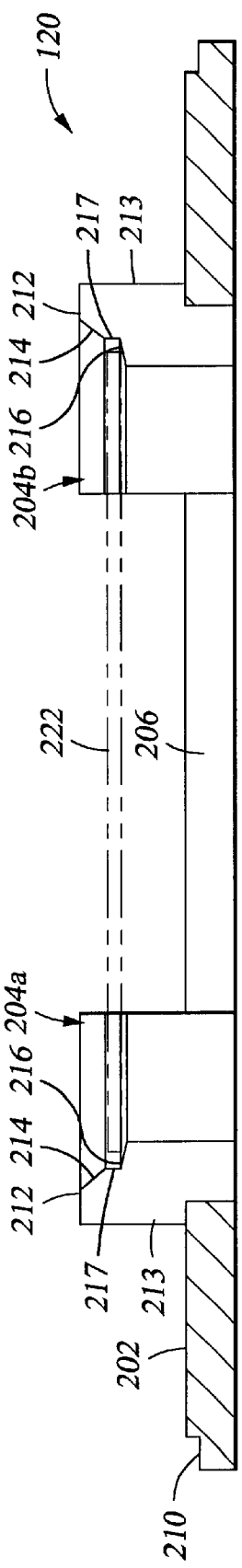
FIG. 6 is a schematic cross-sectional view taken along lines 6—6 of FIG. 3.

FIGS. 5 and 6 are sectional views along the respective section lines 5—5 and 6—6 shown in FIG. 3 further illustrate the substrate support members 204*a–d* of the support ring 120. The substrate support members 204*a–d* are mounted on the base 202 and are disposed around the perimeter of the opening 206. The substrate support members 204 include an upper surface 212, an outer surface 213 and an inner surface 215. The inner surface 215 includes an upper substrate aligning surface 214 which is disposed at an incline from the upper surface 212. The upper aligning surface 214 provides gravity assisted gross alignment of a substrate 222 received thereon. A generally vertical substrate capturing surface 217 is provided below the substrate aligning surface 214 and defines an outer boundary of a substrate receiving area. The lower portion 216 of the substrate support member 204 has an inclined surface disposed at an angle between about 2° and about 7°, preferably between about 2.5° and about 5°. The inclination of the lower portion 116 of the substrate support members 204*a–d* minimizes the surface area contact between the substrate 222 and the substrate support members 204*a–d*. The inclined surface and the lower portion 216 also assists in centering the substrate as it is received thereon.

The support ring 120 is generally formed from of an etch resistant, high temperature resistant material, such as aluminum oxide, to enable the support ring 120 to be used repetitively in the etching process without damage such as scratching or deformation. The support ring 120 is preferably formed from a single piece of material to ensure a good fit with the aluminum pedestal 116. However, the support ring 120 could be made of multiple components.

Figure 7:
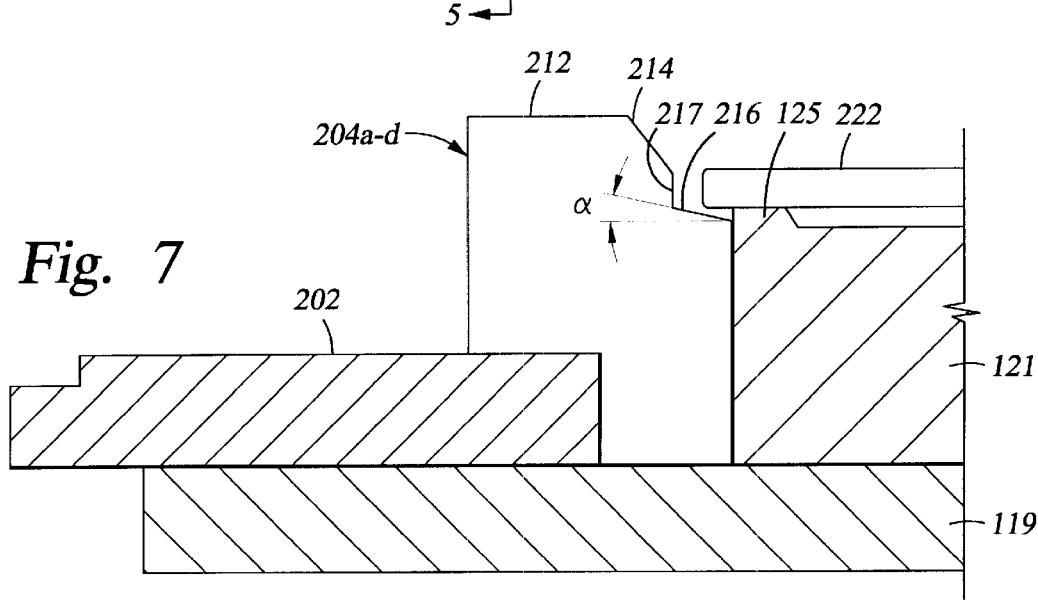
FIG. 7 is a cross-sectional view of the lower pedestal and the upper support ring.

FIG. 7 is a cross sectional view of a lower pedestal 116 showing the substrate supports 204*a–d* and the substrate supporting ridge 125 disposed on the perimeter of the body 121 of the pedestal 116. The substrate supporting ridge 125 defines a supporting surface on which the substrate is supported during processing. A space 170 is defined between the upper surface of the body 121 of the lower pedestal 116 and a lower surface of a substrate 222 when the substrate 222 is received on the substrate supporting ridge 125. A backside gas can be flowed into the space 170 during processing to facilitate thermal conduction and to prevent process gases from being introduced behind the substrate 222. The backside gas can be delivered into the space 170, for example, by the backside gas line 188 disposed in the pedestal 116 from a remotely located backside gas source 190 through gas portals (not shown) to the surface of the cathode 100.

To sufficiently transfer heat from the substrate 222 to the substrate support member 100 and prevent backside contamination, a substantial gas pressure may exist beneath the substrate 222. A clamp ring (not shown) may be fitted to the periphery of the support ring 120 to retain the substrate 222 on the substrate support member 100 when substantial backside gas pressure is applied between the substrate support member 100 and the substrate 222. Such a clamp ring would be similar to that used to retain a substrate on a substrate support member 100 in a M×P chamber of a P5000 platform, as manufactured by Applied Materials, Inc. of Santa Clara, Calif.

Substrate Handler Blade

Figure 8:
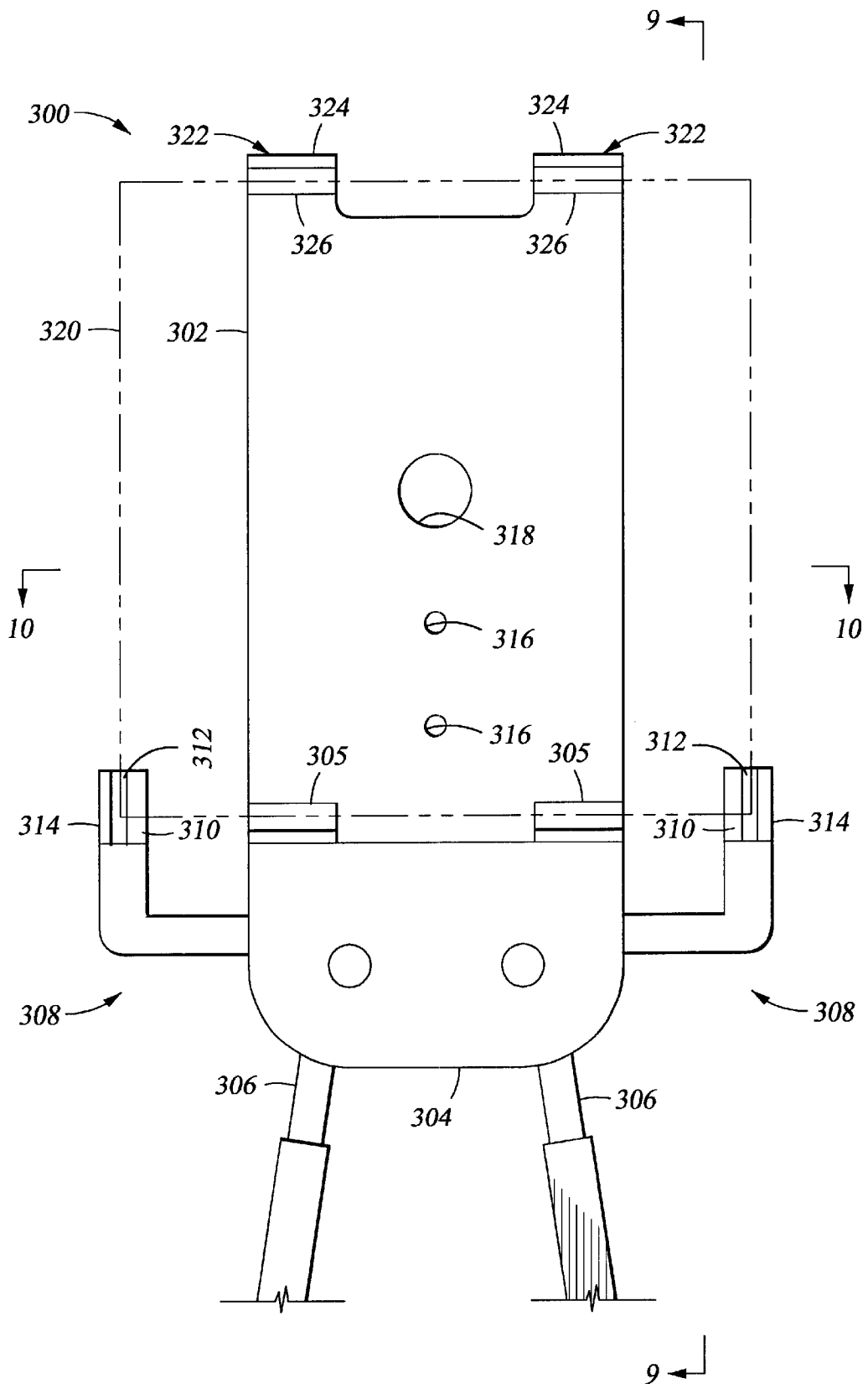
FIG. 8 is a schematic top view of a substrate handler of the invention.

FIG. 8 is a schematic top view of a substrate handler blade 300. The substrate handler blade 300 generally includes a base plate 302 having a pair of substrate supports disposed on both ends thereof. The substrate supports include a pair of fingers 322 and a pair of sloped substrate supports 305. A pair of retaining wings 308 are coupled to the base plate 302 at the base thereof and define substrate supporting surfaces thereon. The retaining wings 308 include a wing base 310, a vertical support 312, and a lateral shoulder 314 to retain a substrate 320 thereon and prevent lateral movement thereof. The retaining wings 308 may be configured in any shape which provides both vertical and lateral support of a substrate 320. As shown, the retaining wings may be "L-shaped" to proved both lateral and vertical support of the substrate 320. The fingers 322 are coupled to the base plate 302 and include vertical supports 326 and a second shoulder 324.

Figure 9:
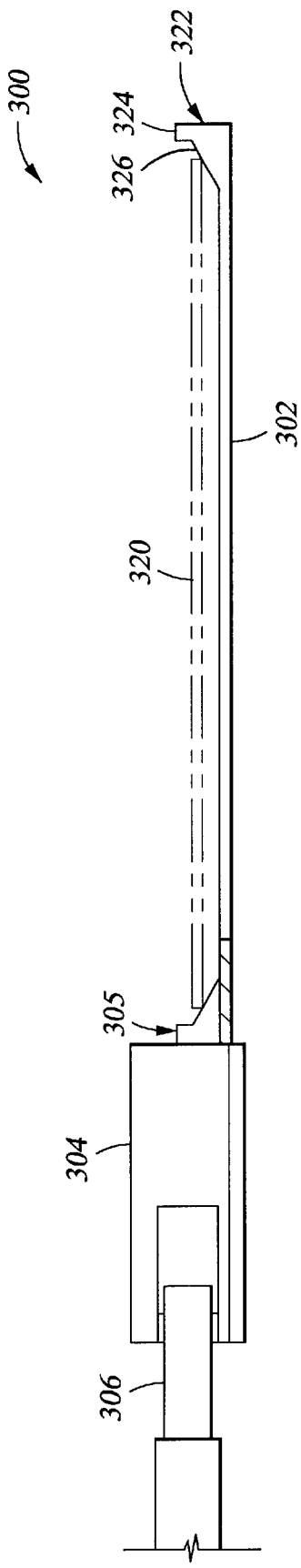
FIG. 9 is a schematic cross section view taken along lines 9—9 of FIG. 8.
Figure 10:
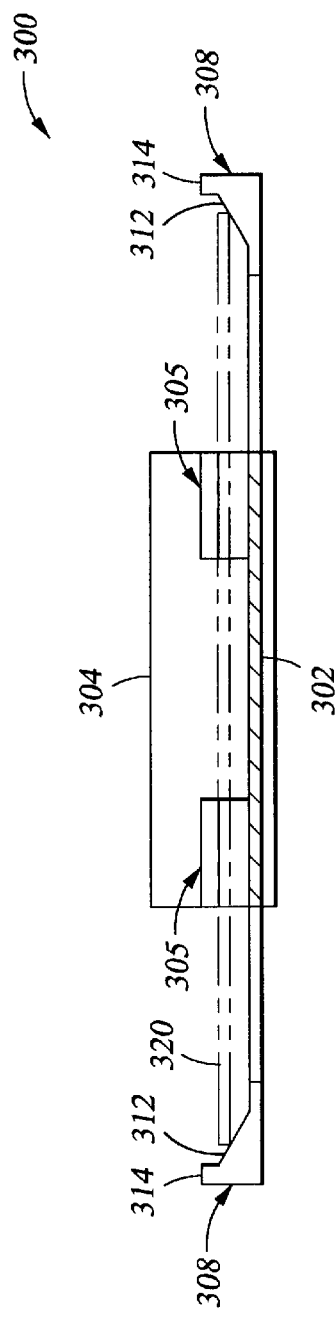
FIG. 10 is a schematic cross section view taken along lines 10—10 of FIG. 8.

FIGS. 9 and 10 are cross sectional views of the substrate handler blade 300 of FIG. 8 taken along lines 9—9 and 10—10, respectively. The shoulders 304 (and surface 305), 314, 324 delineate an area for the substrate 320 (shown in phantom) to be positioned by the substrate handler blade 300. The shoulders 304, 314, 324 prevent the substrate 320 from movement beyond the edges of the blade 300, where such movement may result in damage to the substrate 320 by contact with other components of the blade 300 or result in the loss of substrate alignment and support within a processing system.

When the substrate handler blade 300 retrieves a substrate 320, the substrate 320 rests on the vertical supports 312 of retaining wings 308, on, the vertical supports 326 of retaining fingers 322, and the sloped substrate supports 305 provide substrate alignment on the blade 300.

Figure 11:
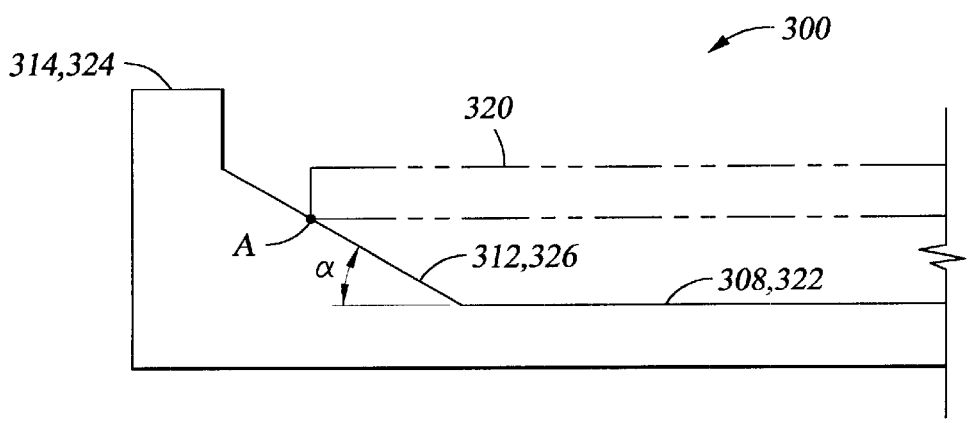
FIG. 11 is a schematic cross-sectional view of the vertical surfaces of the blade 300.

Referring to FIG. 11, the use of inclined surfaced vertical supports 312, 326, limits substrate contact with the substrate handler blade at Point A on the vertical supports 312, 326 and the slope on the substrate support surface 305. The vertical supports 312, 326, and preferably sloped substrate support surface 305 are typically beveled to form a low angle, α, rising from the base plate 302 and wing bases 310 to reduce the contact area between the substrate 320 and the respective vertical supports as the substrate is positioned on the vertical supports 312, 326, and slope substrate support surface 305. The angle α, of the vertical supports 312, 326, and the sloped surface 305 is preferably between about 2° and about 7°, but may vary for use with different substrates in different apparatus and with different substrate handler blades.

Proper alignment of the substrate on the blade is achieved when the blade enters the load lock 416 (as referenced in FIG. 18) containing one or more of loadlock platforms 416. Each loadlock platform is designed to support a substrate with minimal contact between the support and the substrate while allowing access for a blade to deposit and retrieve a substrate for transfer to the processing chambers of the cluster tool (not shown). Proper alignment of the blade 300 and substrate 320 in the retrieval stage ensures minimal substrate movement during transport and reduces the chance for scratching and misalignment when deposited in a processing chamber 412. Alignment is assisted by the use of the one or more alignment openings 316, preferably two disposed laterally along the blade 300. A matching set of alignment openings are disposed in the loadlock platform's base in the same configuration as the one or more alignment openings 316 formed in the blade 300. As the substrate handler enters the loadlock 416, the alignment openings 316 of the blade 300 correspond with the alignment openings in the loadlock platform, thereby ensuring the mounting of the substrate 320 in a preferred position.

It is believed that the presence of the retaining wings 308 reduces the amount of blade deflection to provide tighter blade movement tolerances to ensure that the blade or substrate will not be damaged during movement or placement within the system and that substrate movement on the substrate handler blade is minimized during substrate handling. Blade deflection refers to the stiffness of the blade and the associated droop of the blade experienced when during substrate handling, the blade deflects due to forces acting on the blade and the substrate.

For example, when a substrate is loaded on the blade, the blade deflection can change depending on the speed of substrate movement, substrate mass, wear of substrate handler/blade components, and chamber temperature. By providing structural support from the use of retaining wings 308, the amount of cross blade deflection and substrate movement can be minimized. The amount of deflection can be critical because the misalignment of the substrates during handling can result in misalignment of the substrate on the support ring which may increase the likelihood that defects may be formed in the substrate.

The reduced substrate movement on the blade 300 prevents scratches from forming on the substrate through substrate movement on the blade and also improves alignment of the substrate, thereby providing for less misalignment defects during etching and deposition and removal of the substrate from the support ring 120. Further, by eliminating the need of securing the substrate adapters for substrate transport, less processing steps are require, and smaller space is used, both of which can contribute to higher processing throughput than can be achieved by the prior art.

The blade 300 is preferably made of a stable, lightweight material that reduces blade deflection under varying chamber conditions including pressure and temperature. One preferred material which can be used to advantage in the invention is titanium. Other useful materials include semi-conductive materials to facilitate the discharge of any electrostatic charge which may build up on a substrate. The semi-conductive properties preferably avoid a high conductance that can result in arcing between the blade and other system components. However, etch resistant metals, such as titanium are most preferred. The substrate handler blade 300 of the invention can be used with single substrate handlers, dual substrate handlers, dual independent substrate handlers, dual blade substrate handlers, and various other substrate handler configurations where substrate handler blades are generally employed, preferably for use in transferring substrates in etch processing of photomasks.

Figure 12:
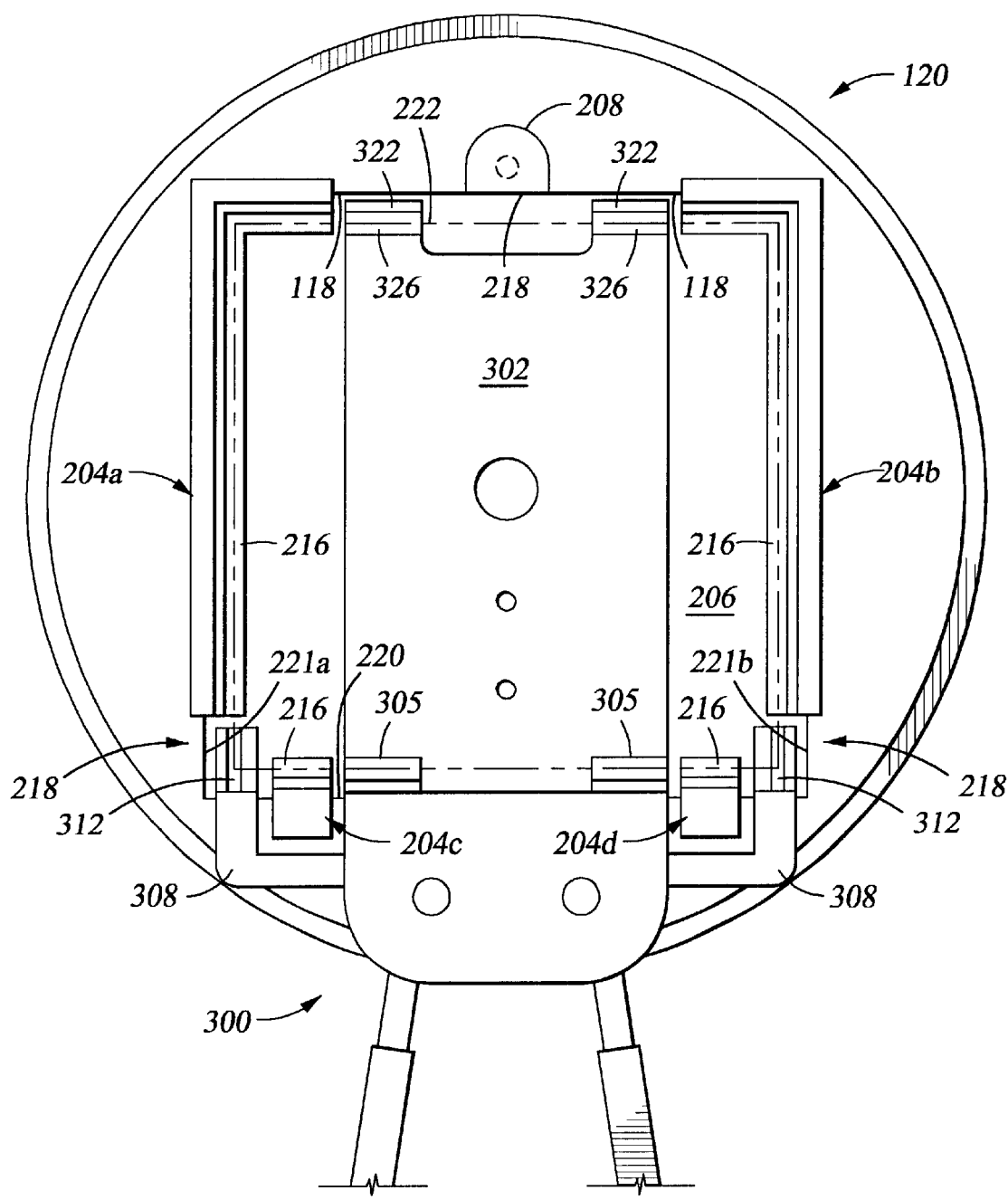
FIG. 12 is a schematic top view of the substrate handler of the invention in conjunction with the support ring of the invention.

FIG. 12 is a top perspective view of a substrate handler blade 300 disposed over a support ring 120 during substrate transfer. A substrate 222 is shown disposed on the inclined substrate support surface 305 and the vertical supports 312, 326 of the blade 300. The base plate 302 of the blade 300 moves through the opening 220 defined between the substrate supports 204c,d disposed at the base of the blade. The retaining wings 308 are aligned with and disposed in the openings 221a,b in the support ring 120. The distal end of the blade 300 is disposed in the opening 118 defined between the distal ends of substrate supports 204a,b. In this substrate transfer position, the inclined substrate support surface 305 and the vertical supports 312, 326 of the blade 300 are aligned with the inclined lower portions 216 of the substrate support members 204. The openings 218, 220, and 221a,b are adapted so that the base plate 302, the retaining fingers 322, and the retaining wings 308 do not contact the support ring 120 during radial movement of the blade or vertical displacement of the support ring 120.

Figure 13:
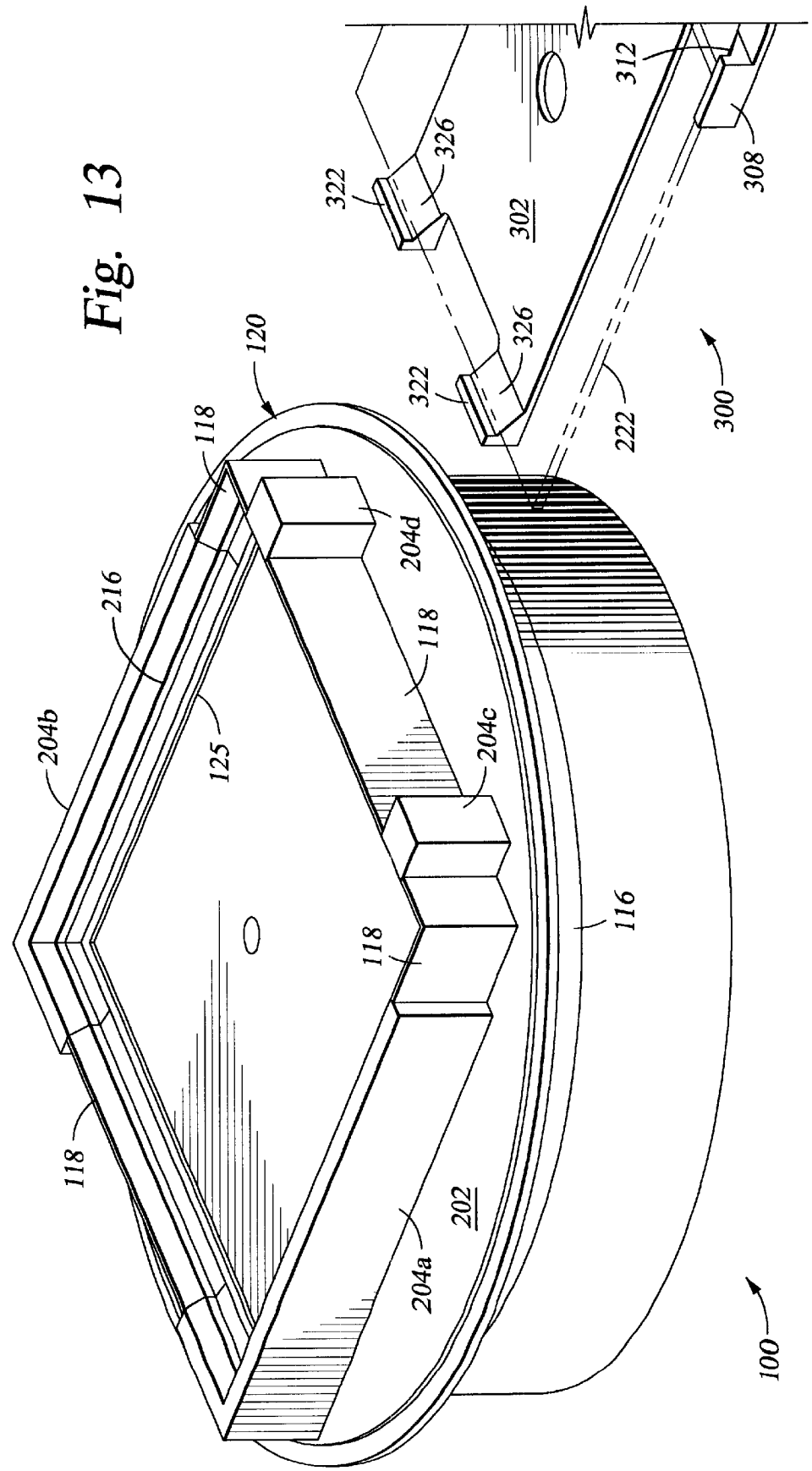
FIG. 13 is a perspective view of the substrate handler of the invention in relation to the support ring of the invention.
Figure 14:
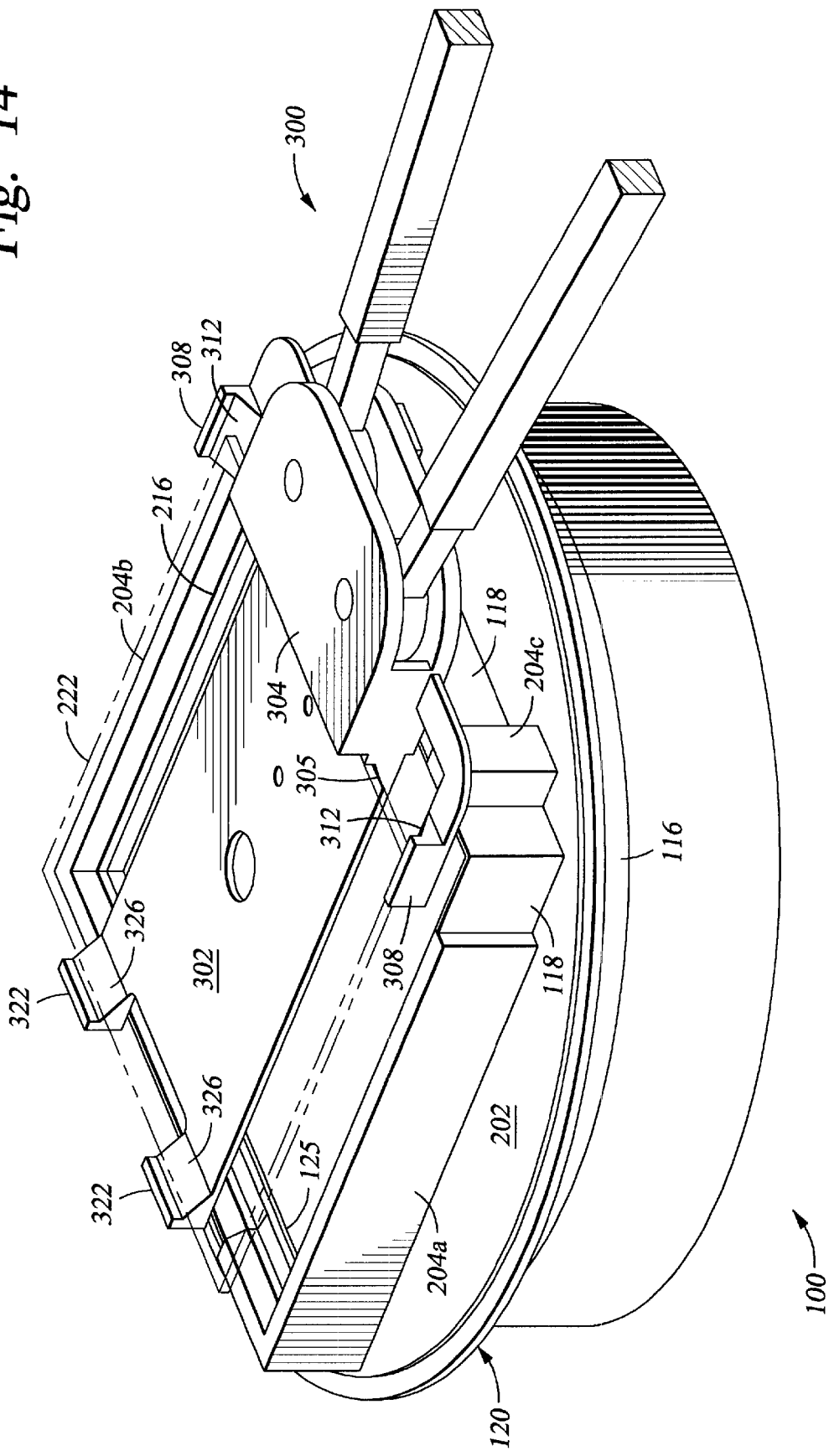
FIG. 14 is a perspective view of FIG. 12.
Figure 15:
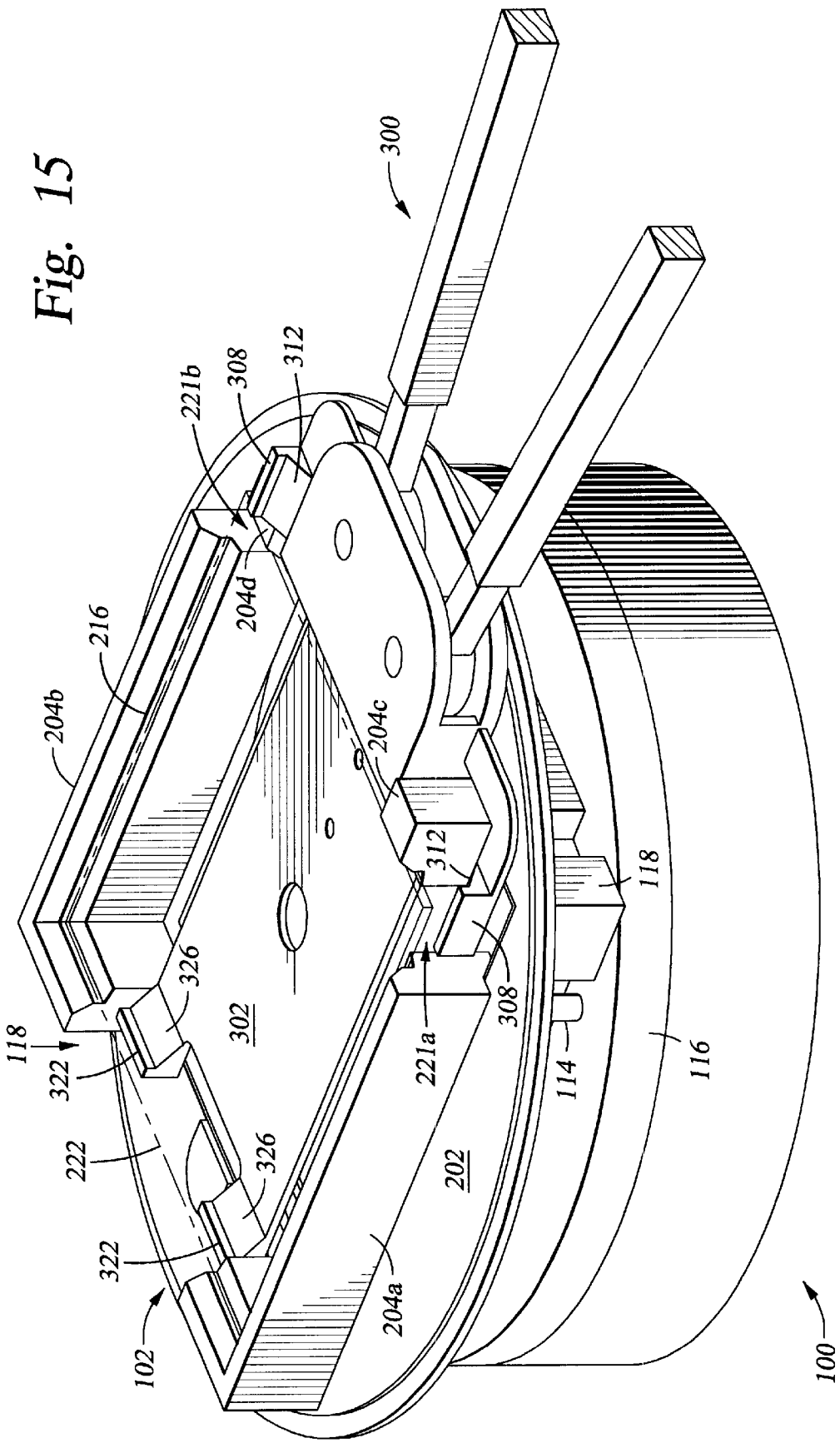
FIG. 15 is a perspective view of the substrate handler of the invention in relation to the support ring of the invention.
Figure 16:
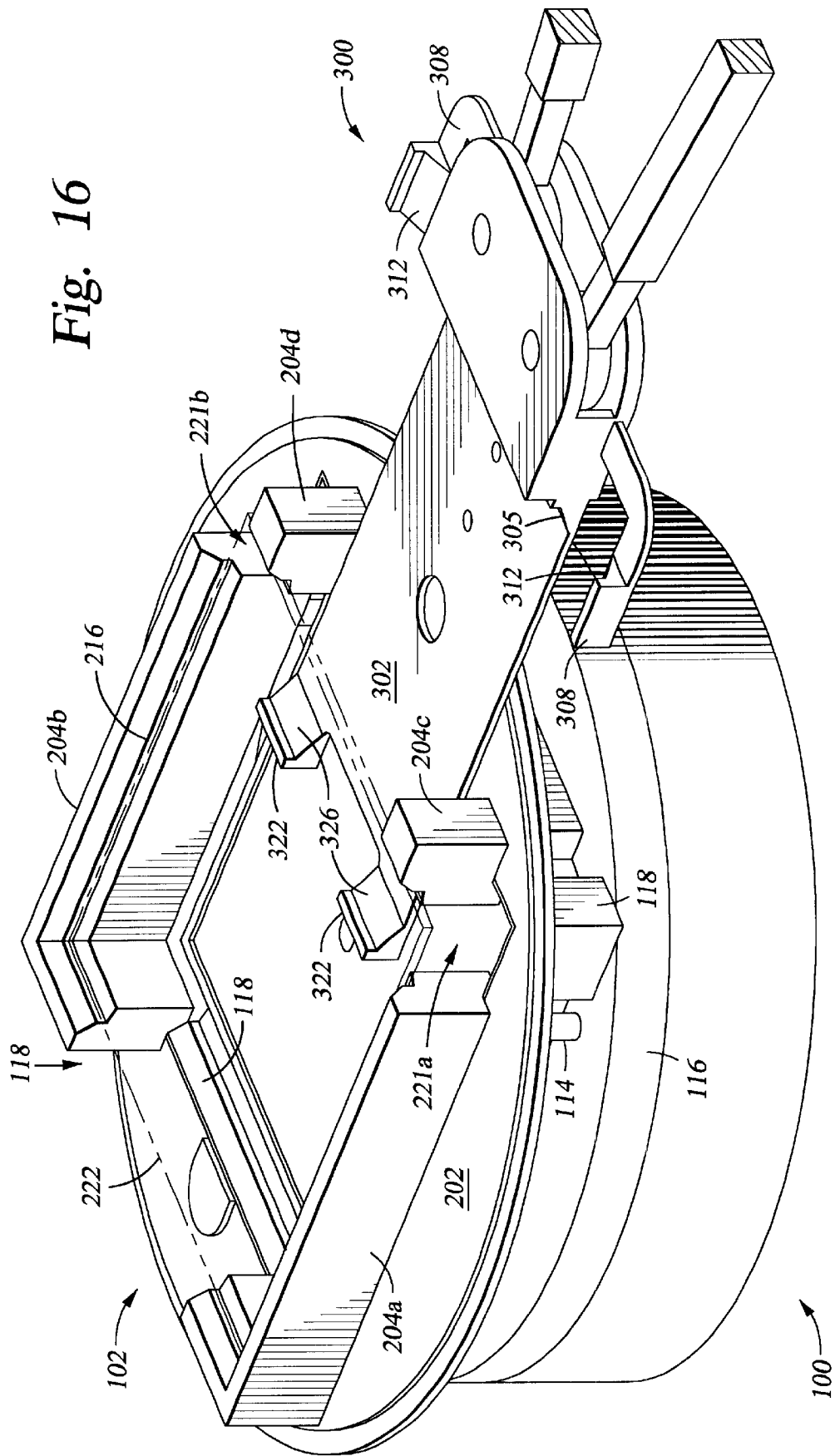
FIG. 16 is perspective view of a substrate in the support ring of the invention.
Figure 17:
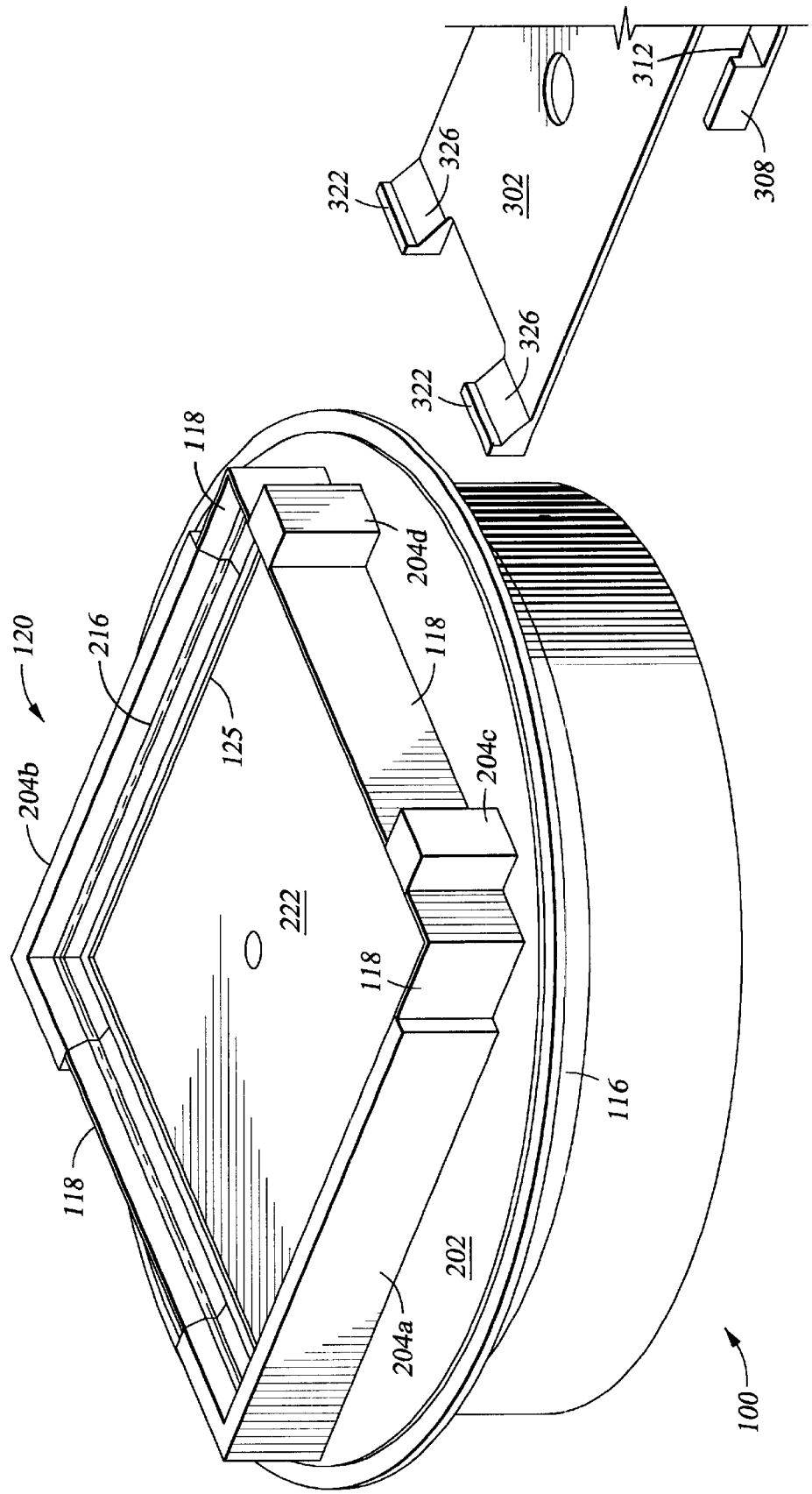
FIG. 17 is perspective view of a substrate in the support ring of the invention.

FIGS. 13–16 illustrate transfer of a substrate 222 from the blade 300 to the support ring 120. The blade 300 retrieves a substrate 222 from a loadlock chamber (not shown) and delivers the substrate 222 into the processing chamber 160 (shown in FIG. 1). The substrate 222 disposed on the blade 300 is then horizontally aligned with the support ring 120 in a vertically displaced position as described above and shown in FIG. 14. The support ring 120 may then be moved upwardly by lift pins 114 to contact and lift the substrate 222 off the blade 300 as shown in FIG. 15. The lower portion 216 of the substrate supports 204a–d lift the substrate 222 from the inclined substrate support surface 305 of the first shoulder and the vertical supports 312, 326 of the retaining wings 308 and fingers 322, respectively. The vertical displacement of the support ring 120 is sufficient to allow to the blade 300 to withdraw from the processing chamber without contacting the top surface 202 of the support ring 120 or the bottom surface of the substrate 222 as shown in FIG. 16. Once the blade is withdrawn, the support ring 120 is lowered by the lift pins onto the substrate supporting ridge 125 of the lower pedestal 116 for processing as shown in FIG. 17.

For retrieving a processed substrate 222 from the support ring 120, the support ring 120 is vertically displaced from the substrate supporting ridge 125 of the lower pedestal 116 to the substrate transfer position. The substrate handler blade 300 enters the processing chamber 412 and aligns the blade 300 between the substrate 222 and the top surface 202 of the support ring 120 as illustrated by FIG. 14. When the blade 300 is aligned with the support ring 120, the inclined substrate support surface 305 and the vertical supports 312, 326 of the blade 300 are disposed in a vertically displaced position below the inclined lower portions 216 of the substrate support members 204. The support ring 120 is then lowered and the inclined substrate support surface 305 and the vertical supports 312, 326 support the substrate 222 thereon as illustrated by FIG. 13. The support ring 120 is vertically displaced in a lowered position to allow the blade 300 to withdraw from the chamber 412 without contact with the support ring 120 as shown in FIG. 13. In the lowered position, the support ring 120 is ready to receive another substrate from the blade 300. The substrate handler blade withdraws from the chamber 412 to return the processed substrate to the loadlock chamber 416 and then to retrieve another substrate 222 for placement in the processing chamber 160.

The supporting apparatus and substrate handler blade 300 described above may also be taken advantage of in a substrate processing system 410 providing support for a substrate. The substrate processing system 410 may include a transfer chamber 414, at least one processing chamber 412 with a substrate support member 100 with a support surface and a support ring coupled to the support surface, the support ring adapted receive a substrate, and a substrate handler 418 disposed in the transfer chamber 414. The substrate handler 418 preferably has a substrate handler blade 300 described above. The process chambers are preferably plasma etch chambers.

Figure 18:
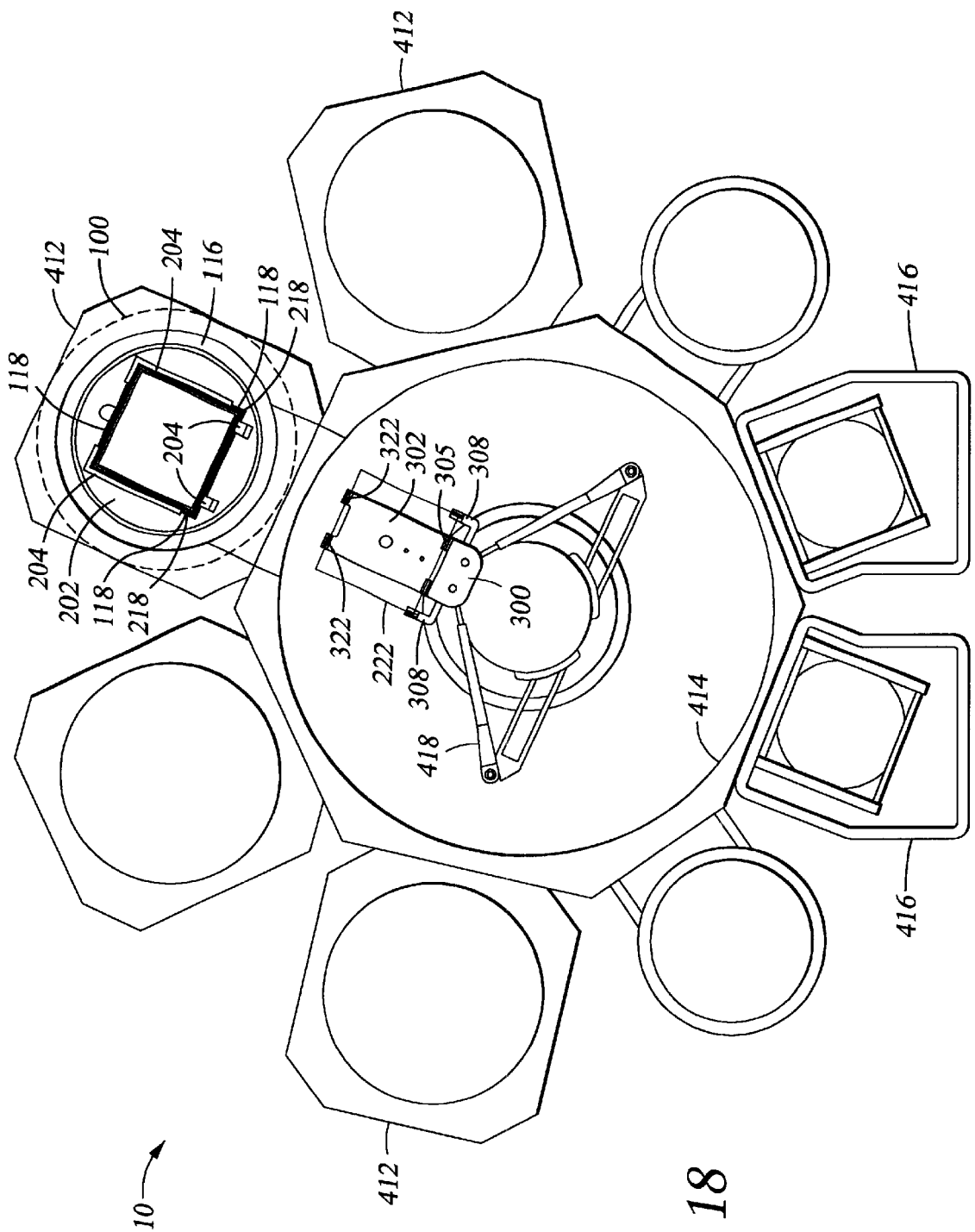
FIG. 18 is a top schematic view of a radial cluster tool for batch processing of semiconductor substrates.

FIG. 18 is a plan view of a vacuum cluster tool 410 suitable for use with the apparatus of the invention described above. The vacuum cluster tool includes multiple substrate processing chambers 412 mounted on a centralized vacuum chamber 414, such as a transfer chamber, for transferring substrates from a substrate cassette located in one or more load lock chambers 416, to one or more process chambers 412. A cluster tool similar to that shown in FIG. 18 is a Centura™ processing system available from Applied Materials, Inc. of Santa Clara, Calif.

Transfer of the substrates between the process chambers 412 is typically managed by a substrate handling module, or substrate handler, 418, preferably with the substrate handling blade 300 mounted thereon. The substrate handler 418 is located in the central transfer chamber 414. After the substrates are processed, the substrates are retrieved from the processing chambers 412 and transferred to one or more of the load lock chamber 416 and into one or more substrate cassette (not shown) disposed within the one or more load lock chambers 416. The substrates can then be retrieved from the loadlock chambers 416 and transferred to the next system for additional processing. In photomask manufacturing processing, the process chambers 412 are etching chambers, preferably plasma etching chambers.

While foregoing is directed to the preferred embodiment of the invention, other and further embodiments of the invention may be devised without departing from the basic scope thereof, and the scope thereof is determined by the claims that follow.

What is claimed is:

1. An apparatus for supporting a substrate, comprising:
   a base plate defining an opening at an interior portion thereof, wherein the base plate is adapted to be mounted on a pedestal and receive one or more lift pins from the pedestal; and
   one or more substrate support members mounted on the base plate and forming a portion of an outer perimeter of the opening, wherein the one or more substrate support members comprise an upper portion, a lower portion, and a tapered portion disposed between the upper portion and lower potion for receiving a substrate vertically displaced above the base plate.

2. The apparatus of claim 1, wherein an edge of the substrate is received on the tapered portion of the one or more substrate support members.

3. The apparatus of claim 2, wherein the tapered portion has an inclined surface of about 2° to about 7°.

4. The apparatus of claim 2, wherein the tapered portion has an inclined surface of about 2.5°.

5. The apparatus of claim 2, wherein the one or more substrate support members are horizontally displaced from one another and adapted to be mated with one or more pedestal substrate supports mounted on the pedestal.

6. The apparatus of claim 2, wherein the support ring comprises an etch resistant material.

7. The apparatus of claim 6, wherein the etch resistant material is aluminum oxide.

8. A substrate processing system, comprising:
a transfer chamber;
at least one processing chamber having:
a pedestal including a support surface and one or more pedestal support members;
a support ring having a base plate defining an opening at an interior portion thereof, wherein the base plate is adapted to be mounted on a support surface and one or more substrate support members mounted on the base plate and forming a portion of an outer perimeter of the opening, wherein the one or more substrate support members comprise an upper portion, a lower portion, and a tapered portion disposed between the upper portion and lower potion and one or more support member openings extending therethrough configured to accept the one or more pedestal substrate support members;
one or more loadlock chambers; and
a substrate handler disposed in the transfer chamber.

9. The substrate processing system of claim 8, wherein the the tapered portion has an inclined surface of about 2° to about 7°.

10. The substrate processing system of claim 8, wherein the substrate handler further comprises a substrate handler blade having a base plate and one or more retaining members extending from the base plate.

11. The substrate processing system of claim 10, wherein the one or more retaining members comprise a base portion, an end portion, and a vertical sort portion forming an inclined surface from the base portion to the end portion.

12. The substrate processing system of claim 11, wherein the inclined surface has an angle of between about 2° and about 7°.

13. The substrate processing system of claim 10, wherein the substrate handler blade comprises a base plate having a first end, a center portion, and a second end;
the one or more retaining members including:
one or more retaining wings extending parallel along the center portion from the first end of the base plate, wherein the one or more retaining wings justify the substrate to the center portion of the base plate; and
one or more retaining fingers extending from the second end of the base plate, wherein the one or more retaining fingers justify the substrate to the center portion of the base plate.

14. The substrate processing system of claim 13, wherein the substrate handler blade further comprises one or more inclined support surfaces disposed on the base plate, wherein the one or more inclined support surfaces justify the substrate to the center portion of the base plate.

15. The substrate processing system of claim 14, wherein the inclined surfaces have an angle of between about 2° and about 7°.

16. A processing chamber, comprising:
an enclosure defining a process region;
a pedestal having a substrate support surface and one or more pedestal substrate support members disposed in the enclosure; and
a base plate defining an opening at an interior portion thereof configured to receive the substrate support surface and one or more substrate support members mounted on the base plate and forming a portion of an outer perimeter of the opening, wherein the one or more substrate support members are adapted to accept a substrate and have one or more support member openings extending therethrough configured to accept the one or more pedestal substrate support members.

17. The processing chamber of claim 16, wherein the one or more second substrate support members comprise an upper portion, a lower portion, and a tapered portion disposed between the upper portion and lower potion for receiving a substrate.

18. The processing chamber of claim 17, wherein the tapered portion has an inclined surface of from about 2° to about 7°.

19. The processing chamber of claim 16, wherein the pedestal further comprises one or more lift pins for vertically displacing a support ring.

20. The processing chamber of claim 16, further comprising one or more inclined support surfaces disposed on the base plate, wherein the one or more inclined support surfaces justify the substrate to the center portion of the base plate.

21. A substrate handler blade, comprising:
a base plate having a first end and a second end;
a shoulder coupled to the first end of the base plate;
one or more inclined support surfaces disposed on the base plate and coupled to the shoulder;
one or more retaining wings extending from the first end of the base plate, wherein the one or more retaining wings comprise a base portion, an end portion, and an inclined surface from the base portion to the end portion; and
one or more retaining fingers disposed on the second end of the base plate, wherein the one or more retaining fingers comprise a base portion, an end portion, and an inclined surface from the base portion to the end portion.

22. The substrate handler blade of claim 21, wherein the one or more inclined surfaces have an angle of between about 2° and about 7°.

* * * * *